United States Patent
Nakamura

(10) Patent No.: US 10,142,756 B2
(45) Date of Patent: Nov. 27, 2018

(54) SIGNAL PROCESSING DEVICE AND SIGNAL PROCESSING METHOD

(71) Applicant: JVC KENWOOD CORPORATION, Yokohama-shi, Kanagawa (JP)

(72) Inventor: Masami Nakamura, Yokohama (JP)

(73) Assignee: JVC KENWOOD CORPORATION, Yokohama-Shi, Kanagawa (JP)

(*) Notice: Subject to any disclaimer, the term of this patent is extended or adjusted under 35 U.S.C. 154(b) by 0 days.

(21) Appl. No.: 15/430,816

(22) Filed: Feb. 13, 2017

(65) Prior Publication Data

US 2017/0156014 A1 Jun. 1, 2017

Related U.S. Application Data

(63) Continuation of application No. PCT/JP2016/059648, filed on Mar. 25, 2016.

(30) Foreign Application Priority Data

Apr. 24, 2015 (JP) .................................. 2015-089031

(51) Int. Cl.
*H04S 1/00* (2006.01)
*H04M 1/74* (2006.01)
*H03M 1/74* (2006.01)

(52) U.S. Cl.
CPC ............... *H04S 1/007* (2013.01); *H03M 1/74* (2013.01); *H04S 2400/13* (2013.01)

(58) Field of Classification Search
CPC .. H04S 1/007; H04S 2400/13; H04S 2420/01; H04S 3/002; H03G 3/3089; H03M 1/74

USPC ..................................................... 381/17, 106
See application file for complete search history.

(56) References Cited

U.S. PATENT DOCUMENTS

2011/0243338 A1* 10/2011 Brown ..................... H04S 3/002
381/17

FOREIGN PATENT DOCUMENTS

JP      2008-22092 A      1/2006
JP      2007/235210 A  *  9/2007

OTHER PUBLICATIONS

PCT/ISA/237 issued in corresponding International Application No. PCT/JP2016/059648.

* cited by examiner

*Primary Examiner* — Yogeshkumar Patel
(74) *Attorney, Agent, or Firm* — Nath, Goldberg & Meyer; Jerald L. Meyer; Stanley N. Protigal

(57) ABSTRACT

A first level converter performs level conversion for a first digital signal into a second digital signal. A second level converter performs level conversion for a third digital signal into a fourth digital signal. An arithmetic unit generates a fifth digital signal obtained by subtracting the fourth digital signal from the second digital signal, and a sixth digital signal obtained by adding the first digital signal and the fourth digital signal to each other. A first DA converter performs DA conversion for the fifth digital signal into a first analog signal. A second DA converter performs DA conversion for the sixth digital signal into a second analog signal. An adder adds the first analog signal and the second analog signal to each other to generate a third analog signal.

4 Claims, 7 Drawing Sheets

FIG. 3A

| INPUT LEVEL | | OUTPUT LEVEL (dB) | ERROR (dB) |
|---|---|---|---|
| (dB) | (RELATIVE VALUE) | | |
| 0.0 | 1.0000000000000000 | 0.0 | 0.0 |
| -2.0 | 0.7943282347242810 | -2.0 | 0.0 |
| -4.0 | 0.6309573444801930 | -4.0 | 0.0 |
| -6.0 | 0.5011872336272720 | -6.0 | 0.0 |
| -8.0 | 0.3981071705534970 | -8.0 | 0.0 |
| -10.0 | 0.3162277660168380 | -10.0 | 0.0 |
| -12.0 | 0.2511886431509580 | -12.0 | 0.0 |
| -14.0 | 0.1995262314968880 | -14.0 | 0.0 |
| -16.0 | 0.1584893192461110 | -16.0 | 0.0 |
| -18.0 | 0.1258925411794170 | -18.0 | 0.0 |
| -20.0 | 0.1000000000000000 | -20.0 | 0.0 |
| -22.0 | 0.0794328234724281 | -22.0 | 0.0 |
| -24.0 | 0.0630957344480193 | -24.0 | 0.0 |
| -26.0 | 0.0501187233627272 | -26.0 | 0.0 |
| -28.0 | 0.0398107170553497 | -28.0 | 0.0 |
| -30.0 | 0.0316227766016838 | -30.0 | 0.0 |
| -32.0 | 0.0251188643150958 | -32.0 | 0.0 |
| -34.0 | 0.0199526231496888 | -34.0 | 0.0 |
| -36.0 | 0.0158489319246111 | -36.0 | 0.0 |
| -38.0 | 0.0125892541179417 | -38.0 | 0.0 |
| -40.0 | 0.0100000000000000 | -40.0 | 0.0 |
| -42.0 | 0.0079432823472428 | -42.0 | 0.0 |
| -44.0 | 0.0063095734448019 | -44.0 | 0.0 |
| -46.0 | 0.0050118723362727 | -46.0 | 0.0 |
| -48.0 | 0.0039810717055350 | -48.0 | 0.0 |
| -50.0 | 0.0031622776601684 | -50.0 | 0.0 |
| -52.0 | 0.0025118864315096 | -52.0 | 0.0 |
| -54.0 | 0.0019952623149689 | -54.0 | 0.0 |
| -56.0 | 0.0015848931924611 | -56.0 | 0.0 |
| -58.0 | 0.0012589254117942 | -58.0 | 0.0 |
| -60.0 | 0.0010000000000000 | -60.0 | 0.0 |
| -62.0 | 0.0007943282347243 | -62.0 | 0.0 |
| -64.0 | 0.0006309573444802 | -64.0 | 0.0 |
| -66.0 | 0.0005011872336273 | -66.0 | 0.0 |
| -68.0 | 0.0003981071705535 | -68.0 | 0.0 |

FIG. 3B

| INPUT LEVEL | | OUTPUT LEVEL (dB) | ERROR (dB) |
|---|---|---|---|
| (dB) | (RELATIVE VALUE) | | |
| −70.0 | 0.0003162277660168 | −70.0 | 0.0 |
| −72.0 | 0.0002511886431510 | −72.0 | 0.0 |
| −74.0 | 0.0001995262314969 | −74.0 | 0.0 |
| −76.0 | 0.0001584893192461 | −76.0 | 0.0 |
| −78.0 | 0.0001258925411794 | −78.0 | 0.0 |
| −80.0 | 0.0001000000000000 | −80.4 | −0.4 |
| −82.0 | 0.0000794328234724 | −82.8 | −0.8 |
| −84.0 | 0.0000630957344480 | −85.2 | −1.2 |
| −86.0 | 0.0000501187233627 | −87.6 | −1.6 |
| −88.0 | 0.0000398107170553 | −90.0 | −2.0 |
| −90.0 | 0.0000316227766017 | −92.4 | −2.4 |
| −92.0 | 0.0000251188643151 | −94.8 | −2.8 |
| −94.0 | 0.0000199526231497 | −97.2 | −3.2 |
| −96.0 | 0.0000158489319246 | −99.6 | −3.6 |
| −98.0 | 0.0000125892541179 | −102 | −4.0 |
| −100.0 | 0.0000100000000000 | −105.4 | −5.4 |
| −102.0 | 0.0000079432823472 | −108.8 | −6.8 |
| −104.0 | 0.0000063095734448 | −112.2 | −8.2 |
| −106.0 | 0.0000050118723363 | −114.2 | −8.2 |
| −108.0 | 0.0000039810717055 | −116.2 | −8.2 |
| −110.0 | 0.0000031622776602 | −118.2 | −8.2 |
| −112.0 | 0.0000025118864315 | −116.2 | −4.2 |
| −114.0 | 0.0000019952623150 | −114.2 | −0.2 |
| −116.0 | 0.0000015848931925 | −112.2 | 3.8 |
| −118.0 | 0.0000012589254118 | −110.2 | 7.8 |
| −120.0 | 0.0000010000000000 | −109.2 | 10.8 |
| −122.0 | 0.0000007943282347 | −108.2 | 13.8 |
| −124.0 | 0.0000006309573445 | −108.2 | 15.8 |
| −126.0 | 0.0000005011872336 | −108.2 | 17.8 |
| −128.0 | 0.0000003981071706 | −108.2 | 19.8 |
| −130.0 | 0.0000003162277660 | −108.2 | 21.8 |
| −132.0 | 0.0000002511886432 | −108.2 | 23.8 |
| −134.0 | 0.0000001995262315 | −108.2 | 25.8 |
| −136.0 | 0.0000001584893192 | −108.2 | 27.8 |
| −138.0 | 0.0000001258925412 | −108.2 | 29.8 |
| −140.0 | 0.0000001000000000 | −108.2 | 31.8 |

FIG. 4A

| INPUT LEVEL | | αL−αR | | L+αR | | OUTPUT LEVEL (dB) | ERROR (dB) |
|---|---|---|---|---|---|---|---|
| (dB) | (RELATIVE VALUE) | (BEFORE DA CONVERSION) | (AFTER DA CONVERSION) | (BEFORE DA CONVERSION) | (AFTER DA CONVERSION) | | |
| 0.0 | 1.000000000000000 | 0.494500 | 0.494500000000000 | 0.505500 | 0.505500000000000 | 0.0 | 0.0 |
| −2.0 | 0.794328234724281 | 0.391664 | 0.391664117362141 | 0.402664 | 0.402664117362141 | −2.0 | 0.0 |
| −4.0 | 0.630957344480193 | 0.309979 | 0.309978672240097 | 0.320979 | 0.320978672240097 | −4.0 | 0.0 |
| −6.0 | 0.501187233627272 | 0.245094 | 0.245093616813636 | 0.256094 | 0.256093616813636 | −6.0 | 0.0 |
| −8.0 | 0.398107170553497 | 0.193554 | 0.193535385276749 | 0.204554 | 0.204553585276749 | −8.0 | 0.0 |
| −10.0 | 0.316227766016838 | 0.152614 | 0.152613883008419 | 0.163614 | 0.163613883008419 | −10.0 | 0.0 |
| −12.0 | 0.251188643150958 | 0.120094 | 0.120094321575479 | 0.131094 | 0.131094321575479 | −12.0 | 0.0 |
| −14.0 | 0.199526231496888 | 0.094263 | 0.094263115748444 | 0.105263 | 0.105263115748444 | −14.0 | 0.0 |
| −16.0 | 0.158489319246111 | 0.073745 | 0.073744659623056 | 0.084745 | 0.084744659623056 | −16.0 | 0.0 |
| −18.0 | 0.125892541179417 | 0.057446 | 0.057446270589708 | 0.068446 | 0.068446270589708 | −18.0 | 0.0 |
| −20.0 | 0.100000000000000 | 0.044500 | 0.044500000000000 | 0.055500 | 0.055500000000000 | −20.0 | 0.0 |
| −22.0 | 0.079432823472428 | 0.034216 | 0.034216411736214 | 0.045216 | 0.045216411736214 | −22.0 | 0.0 |
| −24.0 | 0.063095734448019 | 0.026048 | 0.026047867224010 | 0.037048 | 0.037047867224010 | −24.0 | 0.0 |
| −26.0 | 0.050118723362727 | 0.019559 | 0.019559361681364 | 0.030559 | 0.030559361681364 | −26.0 | 0.0 |
| −28.0 | 0.039810717055350 | 0.014405 | 0.014405358526768 | 0.025405 | 0.025405358526768 | −28.0 | 0.0 |
| −30.0 | 0.031622776601684 | 0.010311 | 0.010311388300842 | 0.021311 | 0.021311388300842 | −30.0 | 0.0 |
| −32.0 | 0.025118864315096 | 0.007059 | 0.007059432157548 | 0.018059 | 0.018059432157548 | −32.0 | 0.0 |
| −34.0 | 0.019952623149689 | 0.004476 | 0.004476311574844 | 0.015476 | 0.015476311574844 | −34.0 | 0.0 |
| −36.0 | 0.015848931924611 | 0.002424 | 0.002424465962306 | 0.013424 | 0.013424465962306 | −36.0 | 0.0 |
| −38.0 | 0.012589254117942 | 0.000795 | 0.000794627058971 | 0.011795 | 0.011794627058971 | −38.0 | 0.0 |
| −40.0 | 0.010000000000000 | −0.000500 | −0.000500000000000 | 0.010500 | 0.010500000000000 | −40.0 | 0.0 |
| −42.0 | 0.007943282347243 | −0.001530 | −0.001528358263786 | 0.009472 | 0.009471641736214 | −42.0 | 0.0 |
| −44.0 | 0.006309573444802 | −0.002350 | −0.002345213277599 | 0.008655 | 0.008654786722401 | −44.0 | 0.0 |
| −46.0 | 0.005011872336273 | −0.002990 | −0.002994063831864 | 0.008006 | 0.008005936168136 | −46.0 | 0.0 |
| −48.0 | 0.003981071705535 | −0.003510 | −0.003509464147232 | 0.007491 | 0.007490535852768 | −48.0 | 0.0 |
| −50.0 | 0.003162277660168 | −0.003920 | −0.003918611699158 | 0.007081 | 0.007081388300842 | −50.0 | 0.0 |
| −52.0 | 0.002511886431509 | −0.004240 | −0.004244056784624 | 0.006756 | 0.006755943215748 | −52.0 | 0.0 |
| −54.0 | 0.001995262314968 | −0.004500 | −0.004502368425156 | 0.006498 | 0.006497631574844 | −54.0 | 0.0 |
| −56.0 | 0.001584893192461 | −0.004710 | −0.004707553403769 | 0.006292 | 0.006292446596230 | −56.0 | 0.0 |
| −58.0 | 0.001258925411794 | −0.004870 | −0.004870537294103 | 0.006129 | 0.006129462705897 | −58.0 | 0.0 |
| −60.0 | 0.001000000000000 | −0.005000 | −0.005000000000000 | 0.006000 | 0.006000000000000 | −60.0 | 0.0 |
| −62.0 | 0.000794328234724 | −0.005100 | −0.005102835826379 | 0.005897 | 0.005897164117362 | −62.0 | 0.0 |
| −64.0 | 0.000630957344480 | −0.005180 | −0.005184521327760 | 0.005815 | 0.005815478672240 | −64.0 | 0.0 |
| −66.0 | 0.000501187233627 | −0.005250 | −0.005249406331864 | 0.005751 | 0.005750593616813 | −66.0 | 0.0 |
| −68.0 | 0.000398107170553 | −0.005300 | −0.005300946414723 | 0.005699 | 0.005699053585276 | −68.0 | 0.0 |

FIG. 4B

| INPUT LEVEL | | αL−αR | | L+αR | | OUTPUT LEVEL(dB) | ERROR (dB) |
|---|---|---|---|---|---|---|---|
| (dB) | (RELATIVE VALUE) | (BEFORE DA CONVERSION) | (AFTER DA CONVERSION) | (BEFORE DA CONVERSION) | (AFTER DA CONVERSION) | | |
| −70 | 0.000316227766016 | −0.005340 | −0.005341886116916 | 0.005658 | 0.005658113830084 | −70.0 | 0.0 |
| −72 | 0.000251188643151 | −0.005370 | −0.005374405678424 | 0.005626 | 0.005625594321576 | −72.0 | 0.0 |
| −74 | 0.000199526231497 | −0.005400 | −0.005400236842516 | 0.005600 | 0.005599763157484 | −74.0 | 0.0 |
| −76 | 0.000158489319246 | −0.005420 | −0.005420755403769 | 0.005579 | 0.005579244596231 | −76.0 | 0.0 |
| −78 | 0.000125892541179 | −0.005440 | −0.005437053729410 | 0.005563 | 0.005562946270590 | −78.0 | 0.0 |
| −80 | 0.000100000000000 | −0.005450 | −0.005450000000000 | 0.005550 | 0.005550000000000 | −80.0 | 0.0 |
| −82 | 0.000079432823472 | −0.005460 | −0.005460283582638 | 0.005540 | 0.005539716417362 | −82.0 | 0.0 |
| −84 | 0.000063095734448 | −0.005470 | −0.005468452132776 | 0.005532 | 0.005531547867224 | −84.0 | 0.0 |
| −86 | 0.000050118723363 | −0.005470 | −0.005474940638319 | 0.005525 | 0.005525059361681 | −86.0 | 0.0 |
| −88 | 0.000039810717055 | −0.005480 | −0.005480094641472 | 0.005520 | 0.005519905358528 | −88.0 | 0.0 |
| −90 | 0.000031622776602 | −0.005480 | −0.005484188611699 | 0.005516 | 0.005515811388301 | −90.0 | 0.0 |
| −92 | 0.000025118864315 | −0.005490 | −0.005487440567842 | 0.005513 | 0.005512559432158 | −92.0 | 0.0 |
| −94 | 0.000019952623150 | −0.005490 | −0.005490023688425 | 0.005510 | 0.005509976311575 | −94.0 | 0.0 |
| −96 | 0.000015848931925 | −0.005490 | −0.005492075534038 | 0.005508 | 0.005507924465962 | −96.0 | 0.0 |
| −98 | 0.000012589254118 | −0.005490 | −0.005493705372941 | 0.005506 | 0.005506294627059 | −98.0 | 0.0 |
| −100 | 0.000010000000000 | −0.005500 | −0.005495000000000 | 0.005505 | 0.005505000000000 | −100.0 | 0.0 |
| −102 | 0.000007943282347 | −0.005500 | −0.005496028358826 | 0.005504 | 0.005503971641174 | −102.0 | 0.0 |
| −104 | 0.000006309573445 | −0.005500 | −0.005496845213278 | 0.005503 | 0.005503154786722 | −104.0 | 0.0 |
| −106 | 0.000005011872336 | −0.005500 | −0.005497494063832 | 0.005503 | 0.005502505936168 | −106.0 | 0.0 |
| −108 | 0.000003981071706 | −0.005500 | −0.005497980094641147 | 0.005502 | 0.005502019905358528 | −108.0 | 0.0 |
| −110 | 0.000003162277660 | −0.005500 | −0.005498418611170 | 0.005501 | 0.005501581388830 | −110.0 | 0.0 |
| −112 | 0.000002511886432 | −0.005500 | −0.005498744056784 | 0.005501 | 0.005501255943216 | −112.0 | 0.0 |
| −114 | 0.000001995262315 | −0.005500 | −0.005499002368842 | 0.005501 | 0.005500997631157 | −114.0 | 0.0 |
| −116 | 0.000001584893192 | −0.005500 | −0.005499207553404 | 0.005501 | 0.005500792446596 | −116.0 | 0.0 |
| −118 | 0.000001258925412 | −0.005500 | −0.005499370537294 | 0.005500 | 0.005500629462706 | −118.0 | 0.0 |
| −120 | 0.000001000000000 | −0.005500 | −0.005499500000000 | 0.005500 | 0.005500500000000 | −120.0 | 0.0 |
| −122 | | | | | | −122.0 | 0.0 |
| −124 | | | | | | −124.0 | 0.0 |
| −126 | | | | | | −126.0 | 0.0 |
| −128 | | | | | | −128.0 | 0.0 |
| −130 | | | | | | −130.0 | 0.0 |
| −132 | | | | | | −132.0 | 0.0 |
| −134 | | | | | | −134.0 | 0.0 |
| −136 | | | | | | −136.0 | 0.0 |
| −138 | | | | | | −138.0 | 0.0 |
| −140 | | | | | | −140.0 | 0.0 |

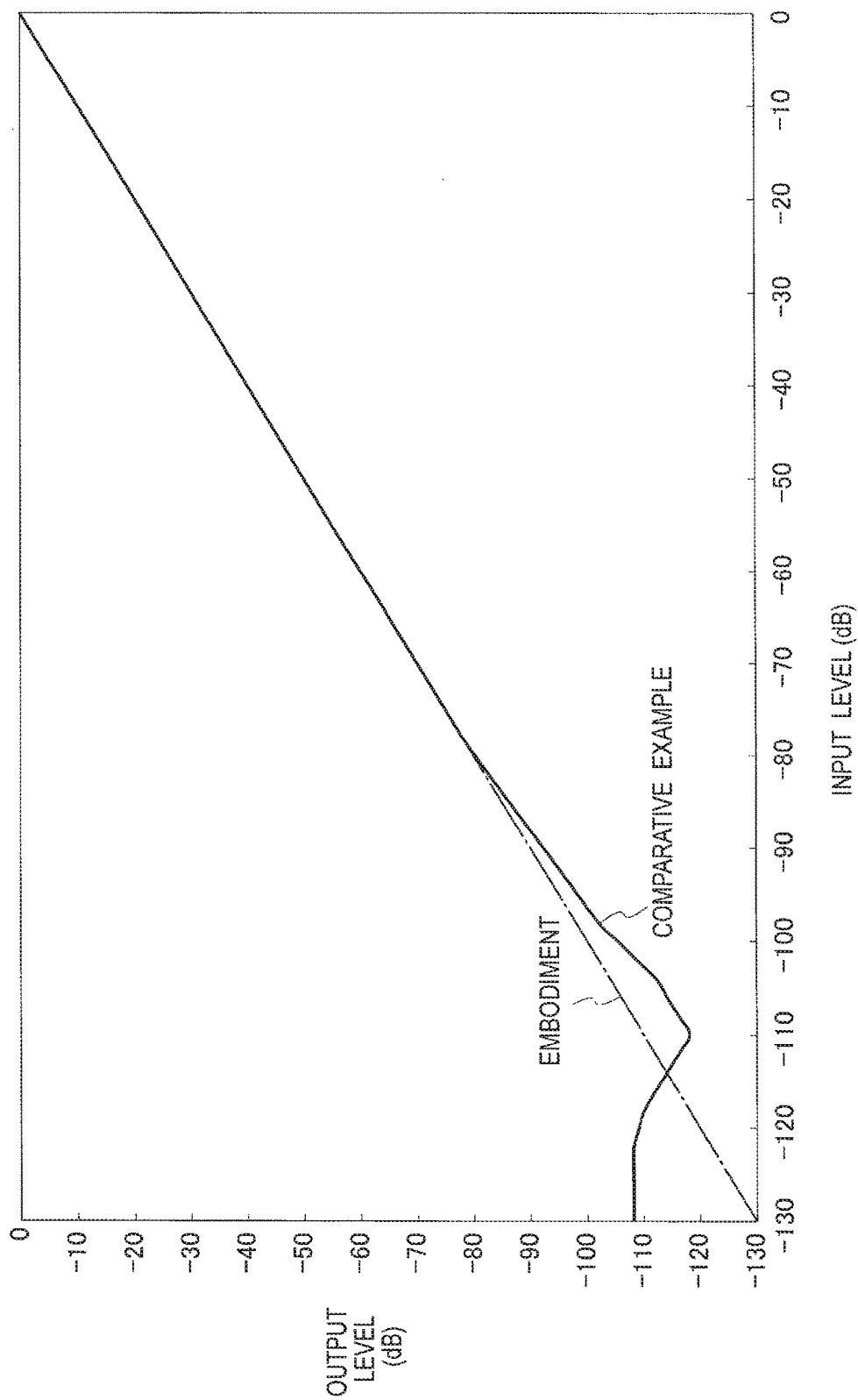

SIGNAL PROCESSING DEVICE AND SIGNAL PROCESSING METHOD

CROSS REFERENCE TO RELATED APPLICATION

This application is a Continuation of PCT Application No. PCT/JP2016/059648, filed on Mar. 25, 2016, and claims the priority of Japanese Patent Application No. 2015-089031, filed on Apr. 24, 2015, the entire contents of both of which are incorporated herein by reference.

BACKGROUND

The present disclosure relates to a signal processing device and a signal processing method.

For an audio signal processing device that is a form of a signal processing device, typically, a digital sound source such as a compact disc (CD) is used. Recently, the volume has not been adjusted after the digital audio signal is subjected to DA conversion (digital/analog conversion) by a DA converter, but the volume has been adjusted on digital data before the digital audio signal is subjected to DA conversion.

Japanese Unexamined Patent Application Publication No. 2008-022092 (Patent Literature 1) describes an example of a means for adjusting the volume on the digital data before performing DA conversion.

SUMMARY

Typically, in the case of adjusting the volume on the digital data before performing DA conversion, the digital data that is an audio signal is reduced, whereby the volume is reduced.

However, in such a conventional signal processing device as described in Patent Literature 1, low-order bits are lost as the volume is being reduced, and accordingly, bit resolution decreases.

Hence, in the conventional signal processing device, the bit resolution decreases when the volume is reduced, and accordingly, a pulse waveform of the audio signal becomes rough, resulting in a degraded sound quality, and that a correlation gap occurs between the input level and the output level.

A first aspect of the embodiments provides a signal processing device including: a first level converter configured to perform level conversion for a first digital signal into a second digital signal; a second level converter configured to perform level conversion for a third digital signal into a fourth digital signal; an arithmetic unit configured to generate a fifth digital signal obtained by subtracting the fourth digital signal from the second digital signal, and a sixth digital signal obtained by adding the first digital signal and the fourth digital signal to each other; a first DA converter configured to perform DA conversion for the fifth digital signal into a first analog signal; a second converter configured to perform DA conversion for the sixth digital signal into a second analog signal; and a first adder configured to add the first analog signal and the second analog signal to each other to generate a third analog signal.

A second aspect of the embodiments provides a signal processing method including: performing level conversion for a first digital signal into a second digital signal; performing level conversion for a third digital signal into a fourth digital signal; generating a fifth digital signal obtained by subtracting the fourth digital signal from the second digital signal, and a sixth digital signal obtained by adding the first digital signal and the fourth digital signal to each other; performing DA conversion for the fifth digital signal into a first analog signal; performing DA conversion for the sixth digital signal into a second analog signal; and adding the first analog signal and the second analog signal to each other and generating a third analog signal.

BRIEF DESCRIPTION OF THE DRAWINGS

FIG. 3A is a table showing simulation results of input/output levels of the signal processing device of the comparative example.

FIG. 3B is a table showing the simulation results of the input/output levels of the signal processing device of the comparative example.

FIG. 4A is a table showing simulation results of the input/output levels of the signal processing device according to the embodiment.

FIG. 4B is a table showing the simulation results of the input/output levels of the signal processing device according to the embodiment.

FIG. 5 is a correlation chart of the input/output levels of the signal processing devices of the embodiment and the comparative example.

DETAILED DESCRIPTION

In the embodiment, an audio signal processing device is described as a form of a signal processing device.

Figure 1:
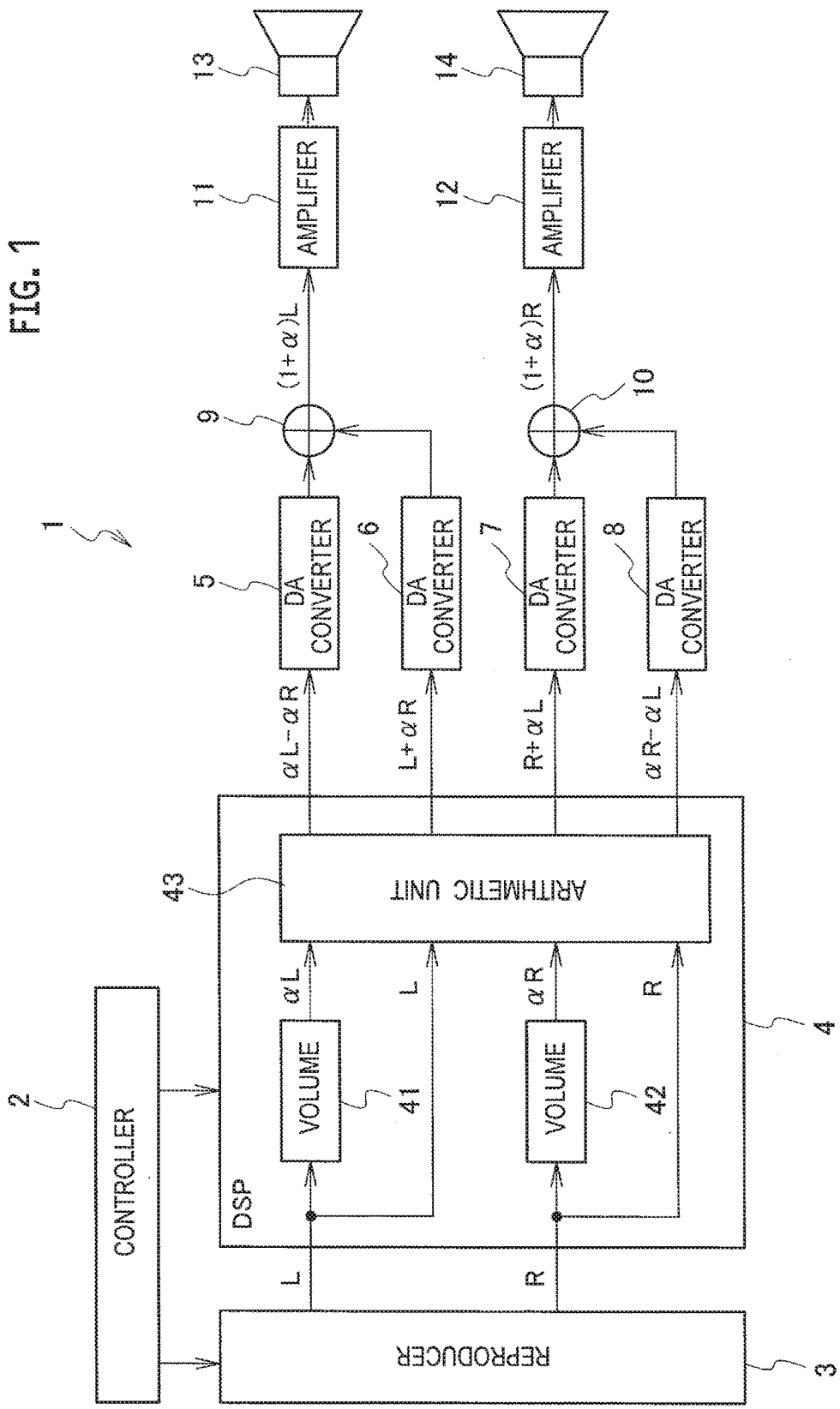
FIG. 1 is a conceptual diagram for explaining a signal processing device to at least one embodiment.

As shown in FIG. 1, an audio signal processing device 1 includes: a controller 2; a reproducer 3; a DSP (digital signal processor) 4; DA converters 5, 6, 7, and 8; adders 9 and 10; amplifiers 11 and 12; and speakers 13 and 14.

The controller 2 controls the reproducer 3 and the DSP 4.

The reproducer 3 outputs digital audio signals from a digital sound source such as a CD to the DSP 4. The digital audio signals are stereo signals with a L (left) channel and a R (right) channel.

Note that reference symbol L in FIG. 1 denotes the digital audio signal. (first digital signal) of the L channel. Reference symbol R denotes the digital audio signal (third digital signal) of the R channel. Hereinafter, the audio signal of the L channel is referred to as an audio signal L, and the audio signal of the R channel is referred to as an audio signal R.

The DSP 4 includes volumes 41 and 42 and an arithmetic unit 43.

The audio signal L is input into the volume 41 from the reproducer 3. The audio signal L is subjected to volume adjustment on digital data by the volume 41. Specifically, by the volume 41, the audio signal L is multiplied by the coefficient $\alpha$ for adjusting the volume to the desired volume, and is subjected to level conversion into the audio signal $\alpha L$, (second digital signal.).

That is, the volume 41 functions as a level converter (first level converter) that performs level conversion for the first digital signal L into the second digital signal $\alpha L$.

The audio signal R is input into the volume 42 from the reproducer 3. The audio signal R is subjected to volume adjustment on digital data by the volume 42. Specifically, by the volume 42, the audio signal R is multiplied by the coefficient α for adjusting the volume to the desired volume, and is subjected to level conversion into the audio signal αR (fourth digital signal.).

That is, the volume 42 functions as a level converter (second level converter) that performs level conversion for the third digital signal R into the fourth digital signal αR.

Note that the coefficient α is set to an arbitrary value from −1 to +1.

The audio signal L and the audio signal R are input into the arithmetic unit 43 from the reproducer 3. The audio signal αL, subjected to level conversion by the volume 41, is input into the arithmetic unit 43. The audio signal αR, subjected to level conversion by the volume 42, is input into the arithmetic unit 43.

The arithmetic unit 43 generates the digital signal αL−αR (fifth digital signal), obtained by subtracting the audio signal αR from the audio signal αL, and outputs the generated digital signal αL−αR to the DA converter 5 (first DA converter).

The arithmetic unit 43 generates the digital signal L+αR (sixth digital signal), obtained by adding the audio signal L and the audio signal αR to each other, and outputs the generated digital signal L+αR to the DA converter 6 (second DA converter).

The arithmetic unit 43 generates the digital signal. R+αL (seventh digital signal), obtained by adding the audio signal R and the audio signal αL to each other, and outputs the generated digital signal R+αL to the DA converter 7 (third DA converter).

The arithmetic unit 43 generates the digital signal αR−αL (eighth digital signal), obtained by subtracting the audio signal αL from the audio signal αR, and outputs the generated digital signal αR−αL to the DA converter 8 (fourth DA converter).

The DA converter 5 performs DA conversion for the digital signal αL−αR, and outputs the analog signal αL−αR (first analog signal) to the adder 9 (first adder).

The DA converter 6 performs DA conversion for the digital signal L+αR, and outputs the analog signal L+αR (second analog signal) to the adder 9.

The DA converter 7 performs DA conversion for the digital signal R+αL, and outputs the analog signal R+αL, (fourth analog signal) to the adder 10 (second adder).

The DA converter 8 performs DA conversion for the digital signal αR−αL, and outputs the analog signal αR−αL (fifth analog signal) to the adder 10. For simplicity, same reference symbols are used for the digital signals before the DA conversion performed by the DA converters 5 to 8 and the analog signals after the DA conversion performed thereby.

The adder 9 adds the analog signal αL−αR and the analog signal L+αR to each other, and generates the analog signal (1+α)L (third analog signal). The analog signal (1+α)L is output as the audio signal Lch of the L channel to the amplifier 11.

The audio signal Lch is represented by Equation (1).

$$Lch=(\alpha L-\alpha R)+(L+\alpha R)=(1+\alpha)L \qquad (1)$$

The adder 10 adds the analog signal R+αL and the analog signal αR−αL to each other, and generates the analog signal (1+α)R (sixth analog signal). The analog signal (1+α)R is output as the audio signal Rch of the R channel to the amplifier 12.

The audio signal Rch is represented by Equation (2).

$$Rch=(R-\alpha L)+(\alpha R-L)=(1+\alpha)R \qquad (2)$$

The audio signal Lch is amplified by the amplifier 11, and is output to the speaker 13. The audio signal Rch is amplified by the amplifier 12, and is output to the speaker 14.

Figure 2:
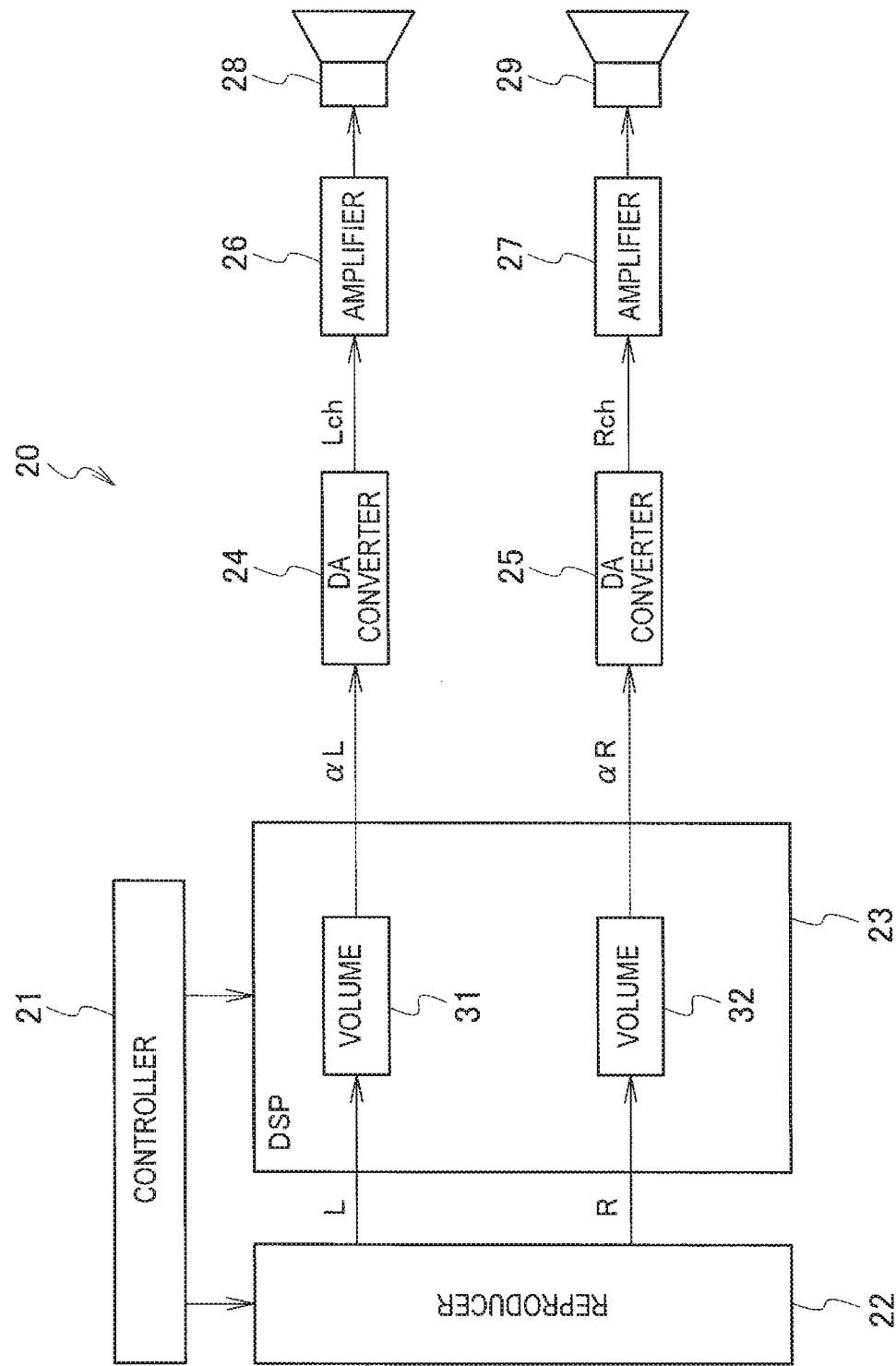
FIG. 2 is a conceptual diagram for explaining a signal processing device of a comparative example.

Here, by using FIG. 2, a description is made of an audio signal processing device of a comparative example.

An audio signal processing device 20 of the comparative example includes: a controller 21; a reproducer 22; a DSP 23; DA converters 24 and 25; amplifiers 26 and 27; and speakers 28 and 29. The DSP 23 includes volumes 31 and 32.

The controller 21, the reproducer 22, the DSP 23, the amplifiers 26 and 27, the speakers 28 and 29, and the volumes 31 and 32 correspond to the controller 2, the reproducer 3, the DSP 4, the amplifiers 11 and 12, the speakers 13 and 14, and the volumes 41 and 42 in FIG. 1, respectively. The DA converter 24 corresponds to the DA converter 5 or the DA converter 6 in FIG. 1. The DA converter 25 corresponds to the DA converter 7 or the DA converter 8 in FIG. 1.

The audio signal processing device 1 according to the embodiment, which is shown in FIG. 1, performs arithmetic processing for the audio signals L, R, αL, and αR on the digital data by the arithmetic unit 43, and generates the digital signals αL−αR, L+αR, R+αL, and αR−αL. The digital signals αL−αR, L+αR, R+αL, and αR−αL are subjected to DA conversion by the first to fourth DA converters 5, 6, 7, and 8, which correspond thereto, respectively.

In contrast, the audio signal processing device 20 of the comparative example is different from the audio signal processing device 1 according to the embodiment, in that the first and second audio signals αL and αR, which are subjected to the volume adjustment on the digital data by the volumes 31 and 32, are subjected to DA conversion by the DA converters 24 and 25.

FIG. 3A and FIG. 3B are tables showing simulation results of an input level of the audio signal αL input into the DA converter 24 and an output level of the audio signal Lch output from the DA converter 24 in the audio signal processing device 20 of the comparative example.

Note that FIG. 3A shows a range where the input level is 0 dB to −68 dB. FIG. 3B shows a range where the input level is −70 dB to −140 dB.

Columns of the input level (dB) in FIG. 3A and FIG. 3B indicate the input level of the audio signal αL input into the DA converter 24 in FIG. 2. Columns of the input level (relative value) indicate the input level of the audio signal αL by relative values when a state where the input level is 0 dB is defined as 1.

Columns of the output level (dB) indicate the output level of the audio signal Lch output from the DA converter 24. Columns of an error indicate a difference of the output level with respect to the input level.

In the audio signal processing device 20 of the comparative example, an error occurs in the output level when the input level becomes −80 dB or less. The error in the output level is increased as the input level becomes smaller, that is, as the volume is reduced.

The error that occurs in the output level, when the input level becomes −80 dB or less, is mainly caused by the performance of the DA converter. That is, in the audio signal processing device 20 of the comparative example, a shift occurs in correlation between the input level and the output level, depending on the performance of the DA converter.

FIG. 4A and FIG. 4B are tables showing simulation results of the input level of the audio signal αL input into the arithmetic unit 43, the input/output levels of the digital signals αL−αR and L+αR input into the DA converters 5 and 6, and the output level of the audio signal Lch output from the adder 9 in the audio signal processing device 1 of the embodiment.

Note that FIG. 4A shows a range where the input level is 0 dB to −68 dB. FIG. 4B shows a range where the input level is −70 dB to −140 dB.

Columns of the input levels (dB) in FIG. 4A and FIG. 4B indicate the input level of the audio signal αL input into the arithmetic unit 43 in FIG. 1. Columns of the input level (relative value) indicate the input level of the audio signal αL by relative values when the state where the input level is 0 dB is defined as 1.

Columns of αL−αR (before DA conversion) indicate the input level of the digital signal αL−αR, which is output from the arithmetic unit 43 in FIG. 1, and input to the DA converter 5. Columns of αL−αR (after DA conversion) indicate the output level of the analog signal αL−αR output from the DA converter 5 to the adder 9.

Columns of L+αR (before DA conversion) indicate the input level of the digital signal L+αR, which is output from the arithmetic unit 43, and input to the DA converter 6. Columns of L+αR (after DA conversion) indicate the output level of the analog signal L+αR output from the DA converter 6 to the adder 9. Note that the digital signal L+αR is set so as to reach a level obtained by adding 0.011 dB to that of the digital signal L+αR.

Columns of the output levels indicate the output level of the audio signal Lch output from the DA adder 9. Columns of an error indicate a difference of the output level with respect to the input level.

As shown in FIG. 3A and FIG. 3B, in the audio signal processing device 20 of the comparative example, the error occurs in the output level when the input level becomes −80 dB or less. The input level of the DA converter 24 in this case is 0.0001 or less.

In contrast, as shown in FIG. 4A and FIG. 4B, in the audio signal processing device 1 according to the embodiment, even when the input level is −80 dB or less, both of the input level of the digital signal αL−αR to the DA converter 5 and the input level of the digital signal L+αR to the DA converter 6 are levels larger than 0.0001.

Hence, in accordance with the audio signal processing device 1 according to the embodiment, the decrease of the bit resolution can be suppressed even when the volume is reduced, and the correlation between the input level and the output level in each of the DA converters 5 and 6 is ensured without being affected by the performance of the DA converters 5 and 6.

The analog signal αL−αR and the analog signal L+αR, which have the output levels individually having the correlations with the input levels of the signals input into the DA converters 5 and 6, are added to each other by the adder 9. Hence, in the audio signal processing device 1 according to the embodiment, the input levels of the audio signal and the output levels thereof have correlations, in which errors do not occur.

Moreover, the analog signal αL−αR and the analog signal L+αR are added to each other after being subjected to DA conversion, and accordingly, in the case where conversion noise and external noise after DA conversion are not in the same phase, the noises decrease by 6 dB, and in the case where the conversion noise and the external noise are in the same phase, the conversion noise and the external noise can be cancelled with each other.

Note that, also with regard to DA conversion of the audio signal of the R channel, similar effects to those in the above-described DA conversion of the audio signal of the L channel are obtained.

FIG. 5 is a correlation chart of the input/output levels of the audio signals in the audio signal processing device 1 according to the embodiment and the audio signal processing device 20 of the comparative example. As shown in FIG. 5, in the audio signal processing device 20 of the comparative example, the input level and the output level have a correlation indicating characteristics as shown by a solid line. The audio signal processing device 1 according to the embodiment has such characteristics as shown by the solid line in a similar way to the audio signal processing device 20 of the comparative example, in the case where the input level is −80 dB or more, and has such characteristics as shown by an alternate long and short dash line in the case where the input level is −80 dB or less.

In the audio signal processing device 20 of the comparative example, the output level has the correlation with the input level in the case where the input level is −80 dB or more; however, the shift occurs in the correlation in the case where the input level is −80 dB or less.

In contrast, in the audio signal processing device 1 according to the embodiment, the output level has the correlation with the input level even when the input level is −80 dB or less.

Hence, in accordance with the signal processing device 1 and the signal processing method according to the embodiment, the decrease of the bit resolution, which occurs in the case of reducing the volume, can be suppressed, and accordingly, in comparison with the conventional case, degradation of the sound quality can be suppressed, and the correlation of the output level with respect to the input level can be improved.

Note that the present invention is not limited to the embodiment mentioned above, and is changeable in various ways within the scope without departing from the scope of the present invention.

For example, in the case of clipping the audio signals by digital blocks, it is possible to cope with the clipping by performing halving processing for the levels thereof at previous stages of the volumes 41 and 42, or at a previous stage of the arithmetic unit 43.

Moreover, in the embodiment, the audio signal L is defined as the first digital signal, the audio signal αL is defined as the second digital signal, the audio signal R is defined as the third digital signal, and the audio signal αR is defined as the fourth digital signal; however, L and R may be reversed.

That is, the audio signal R may be defined as the first digital signal, the audio signal αR may be defined as the second digital signal, the audio signal L may be defined as the third digital signal, and the audio signal αL may be defined as the fourth digital signal.

In this case, the digital signal αR at becomes the fifth digital signal. The digital signal R+αL at becomes the sixth digital signal. The digital signal L+αR becomes the seventh digital signal. The digital signal αL−αR becomes the fifth digital signal.

The DA converter 8 becomes the first DA converter. The DA converter becomes the second. DA converter. The DA converter 6 becomes the third. DA converter. The DA converter 5 becomes the fourth DA converter. The adder 10 becomes the first adder. The adder 9 becomes the second adder.

What is claimed is:

1. A signal processing device for processing a digital stereo signal including a left channel signal and a right channel signal, comprising:
   a first level converter configured to perform level conversion for a first digital signal of the left channel signal into a second digital signal, the first level converter multiplying the first digital signal by a coefficient for adjusting a volume of the left channel signal;
   a second level converter configured to perform level conversion for a third digital signal of the right channel signal into a fourth digital signal, the second level converter multiplying the third digital signal by the coefficient for adjusting a volume of the right channel signal;
   an arithmetic unit configured to generate a fifth digital signal obtained by subtracting the fourth digital signal from the second digital signal, a sixth digital signal obtained by adding the first digital signal and the fourth digital signal to each other, a seventh digital signal obtained by adding the second digital signal and the third digital signal to each other, and an eighth digital signal obtained by subtracting the second digital signal from the fourth digital signal;
   a first DA converter configured to perform DA conversion for the fifth digital signal into a first analog signal;
   a second DA converter configured to perform DA conversion for the sixth digital signal into a second analog signal;
   a third DA converter configured to perform DA conversion for the seventh digital signal into a fourth analog signal;
   a fourth DA converter configured to perform DA conversion for the eighth digital signal into a fifth analog signal;
   a first adder configured to add the first analog signal and the second analog signal to each other to generate a third analog signal, the third analog signal being a volume-adjusted left channel signal; and
   a second adder configured to add the fourth analog signal and the fifth analog signal to each other to generate a sixth analog signal, the sixth analog signal being a volume-adjusted right channel signal.

2. A signal processing method for processing a digital stereo signal including a left channel signal and a right channel signal, the method comprising:
   performing a first level conversion for a first digital signal of the left channel signal into a second digital signal, the first level conversion comprising multiplying the first digital signal by a coefficient for adjusting a volume of the left channel signal;
   performing a second level conversion for a third digital signal of the right channel signal into a fourth digital signal, the second level conversion comprising multiplying the third digital signal by the coefficient for adjusting a volume of the right channel signal;
   generating a fifth digital signal obtained by subtracting the fourth digital signal from the second digital signal, a sixth digital signal obtained by adding the first digital signal and the fourth digital signal to each other, a seventh digital signal obtained by adding the second digital signal and the third digital signal to each other, and an eighth digital signal obtained by subtracting the second digital signal from the fourth digital signal;
   performing DA conversion for the fifth digital signal into a first analog signal;
   performing DA conversion for the sixth digital signal into a second analog signal;
   performing DA conversion for the seventh digital signal into a fourth analog signal;
   performing DA conversion for the eighth digital signal into a fifth analog signal;
   adding the first analog signal and the second analog signal to each other and generating a third analog signal, the third analog signal being a volume-adjusted left channel signal, and
   adding the fourth analog signal and the fifth analog signal to each other to generate a sixth analog signal, the sixth analog signal being a volume-adjusted right channel signal.

3. The signal processing device according to claim 1, wherein the coefficient is an arbitrary value from −1 to +1.

4. The signal processing method according to claim 2, wherein the coefficient is an arbitrary value from −1 to +1.

* * * * *